United States Patent
Chang et al.

[11] Patent Number: 5,838,716
[45] Date of Patent: Nov. 17, 1998

[54] LEAK CHECK PROCEDURE FOR A DRY OXIDATION FURNACE TUBE

[75] Inventors: Hui-Hua Chang; Yu-Jen Yu; Chi-Fu Ni, all of Hsin-Chu, Taiwan

[73] Assignee: Taiwan Semiconductor Manufacturing Company, Ltd., Hsin-Chu, Taiwan

[21] Appl. No.: 868,339

[22] Filed: Jun. 3, 1997

[51] Int. Cl.⁶ .................................. F27D 7/06; F27B 5/14
[52] U.S. Cl. ........................... 373/111; 373/110; 219/390
[58] Field of Search ........................... 373/109–113, 135; 219/385, 388–392, 397, 400, 402, 403, 406, 413; 204/1 T, 129.3, 195 R; 134/2, 3, 22.1, 22.12, 37; 427/523; 423/348; 437/233

[56] References Cited

U.S. PATENT DOCUMENTS

| | | | |
|---|---|---|---|
| 4,180,439 | 12/1979 | Deines et al. | 204/1 T |
| 5,024,972 | 6/1991 | DePinto et al. | 437/233 |
| 5,637,153 | 6/1997 | Nino et al. | 134/22.11 |

OTHER PUBLICATIONS

S.Wolf et al. "Silicon Processing For The VLSI Era—vol. 1" Lattice Press, Sunset Beach, CA. 1986, p. 207.

*Primary Examiner*—Tu Ba Hoang
*Attorney, Agent, or Firm*—George O. Saile; Stephen B. Ackerman

[57] ABSTRACT

A method of testing a dry oxidation furnace for leaks which permit the entry of moisture into the oxidizing ambient is described. Such moisture, when present in sufficient concentration, can cause a high degree of boron depletion in silicon at p-type contact interfaces in the manufacture of p-channel MOSFETs. The depleted silicon presents a high resistance component to the contact thereby compromising its performance. A test wafer is subjected to a non-oxidizing ambient in the furnace according to a prescribed procedure. Measurements of the thickness of an oxide layer on the test wafer before and after the procedure indicate the presence of a leak of sufficient proportions to cause a deterioation of contact performance if the oxide grown during the test procedure exceeds between about 25 to 35 Angstroms. The procedure is also useful as a simple means of monitoring an oxidation furnace to provide a record of performance and signal the development of trends which suggest appropriate remedial maintenance.

7 Claims, 2 Drawing Sheets

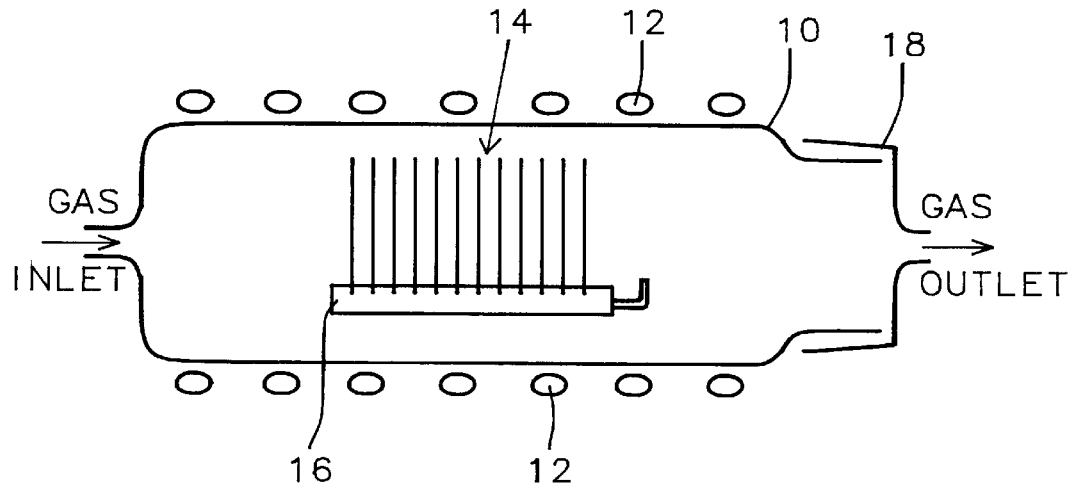
FIG. 1 - Prior Art
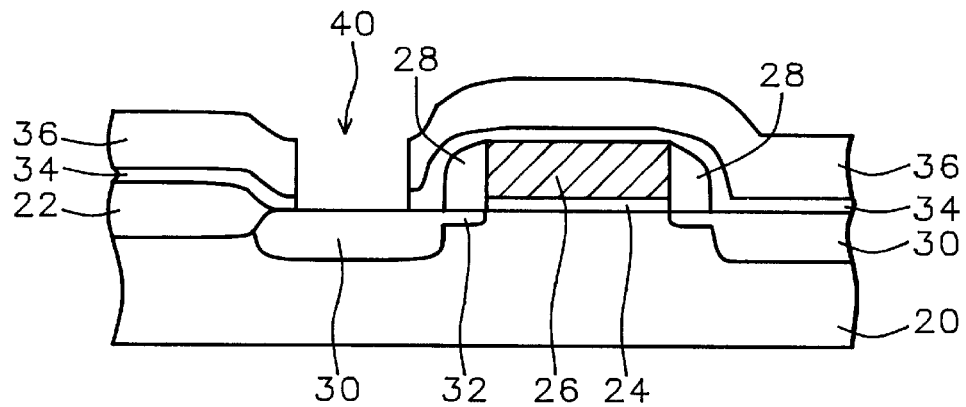
FIG. 2 - Prior Art
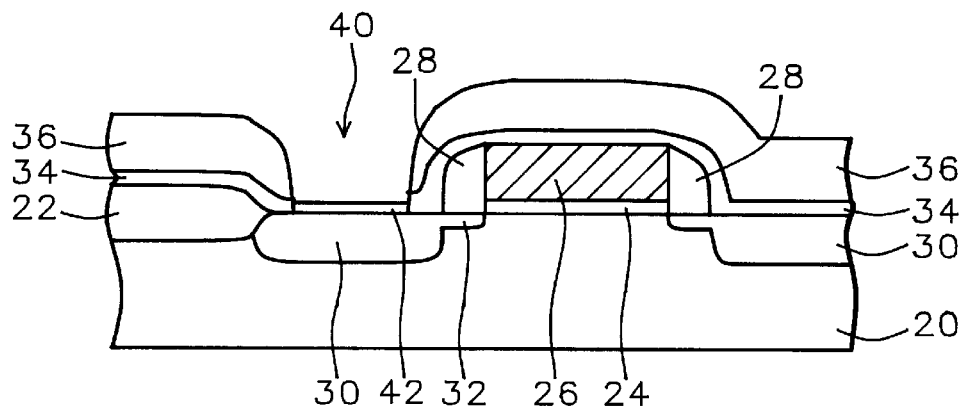
FIG. 3 - Prior Art

5,838,716

LEAK CHECK PROCEDURE FOR A DRY OXIDATION FURNACE TUBE

BACKGROUND OF THE INVENTION (1) Field of the Invention

The invention relates to processes for the manufacture of integrated circuits and more particularly to processes involving the oxidation of silicon wafers.

(2) Description of Prior Art

The successful use of silicon for integrated circuits for the last thirty years can, in part, be attributed to the marvelous insulating properties of it's oxide. No other commonly known semiconductor material has this unique feature. Thus silicon oxide has become well established as the isolation material for integrated circuit chips and as an insulation material for electrical circuitry formed over the chip which interconnects the various semiconductive elements.

Silicon oxide is formed either by deposition by chemical or physical procedures or by the thermal oxidation of the silicon wafer substrate or a polysilicon layer. The thermal oxidation of the silicon substrate is typically accomplished by placing the wafer into an oxidation furnace in an ambient of either dry oxygen or oxygen with water vapor. The former is referred to as dry oxidation and the latter as wet oxidation. A typical oxidation furnace is shown in cross section be FIG. 1. The furnace comprises a fused quartz tube 10 surrounded by a resistive heating element 12. The silicon wafers 14 are supported in a boat 16, also of fused quartz and are loaded and removed through a port 18 at the end of the furnace tube 10.

The kinetics of dry and wet oxidation are identical but the mechanisms are different. The oxidation reaction occurs at the $Si/SiO_2$ interface. Thus, during the initial stages the growth rate of the $SiO_2$ layer is proportional to the rate of the reaction. As the oxide layer grows the rate is determined by the transport of oxidizing species through the growing oxide layer. This so-called linear-parabolic behavior is observed for dry and wet oxidation. However the linear rate constant for wet oxidation is more than 10 times that for dry oxidation over a wide range of temperatures. (See Wolf, S. and Tauber, R. N., "Silicon Processing for the VLSI Era", Vol. 1, Lattice Press, Sunset Beach, Calif., (1986), p207).

The segregation coefficient of boron in the case of p-type silicon, is of the order of 0.3. This means that boron at the $Si/SiO_2$ interface will segregate into the $SiO_2$. The boron concentration in the silicon at the interface will then be depleted with respect to the bulk concentration. The presence of hydrogen, which occurs during wet oxidation, causes an even more pronounced depletion of boron in the silicon at the $Si/SiO_2$ interface(ibid. p229).

In order to minimize boron depletion, all thermal oxidation steps wherein the active elements of the PMOS device are effected are done in dry oxygen. These include the formation of the gate oxide and the oxidation of contact openings which accompanies the reflow of a borophosphosilicate glass. The following example is used to illustrate the effect of boron depletion caused by a furnace leak, on a contact to a p-channel device.

A p-channel MOSFET (Metal oxide silicon field effect transistor) requires the formation ohmic contacts to boron doped silicon regions which are the source and drain regions of the device. These MOSFETs, commonly referred to as PMOS devices are used in CMOS (Complimentary MOS) integrated circuits. The contacts are formed after the gate electrode has been patterned and the source/drain active regions have been created by ion implantation of boron. An insulative layer such as a borophosphosilicate glass (BPSG) is deposited over the silicon wafer substrate containing the devices. Contact openings are patterned in the insulative layer using well known techniques of photolithography and reactive ion etching (RIE). These contact openings provide access to both source and drain active regions as well as the gate electrode.

Referring to FIG. 2 there is shown a cross section of a portion of a p-channel MOSFET formed on a silicon wafer 20. The device shown has the well known lightly doped drain (LDD) structure, having a lightly doped region 32 beneath a sidewall 28 and a heavily doped region 30 to which a source/drain contact is to be formed. A field oxide 22 provides isolation of the device within the integrated circuit. The polysilicon gate electrode 26 lies over a thin gate oxide 24. In order to form a contact to the source/drain diffusion 30 a layer of undoped silicon oxide 34 is deposited over the wafer 20 by chemical vapor deposition. A thicker layer of a flowable glass such as borophosphosilicate glass (BPSG) 36 is then deposited to form a inter level dielectric layer (ILD).

A contact opening 40 is formed by patterning a layer of photoresist over the wafer and subjecting the ILD to reactive ion etching (RIE). This anisotropic etching technique leaves a contact opening with steep sidewalls. Referring next to FIG. 3, the cross section of the device is shown wherein the walls have been smoothed by thermally flowing the BPSG. This is done to improve the step coverage of the subsequently deposited metallization. The BPSG is re-flowed in a dry oxygen ambient whereby a silicon oxide layer 42 is grown at the base of the contact opening. The silicon oxide layer 42 serves to protect the surface of the boron doped p+ silicon 30 from auto-doping by phosphorous emanating from the BPSG.

After the re-flow step the oxide layer 42 is etched away and a preferred contact metallurgy is deposited into the opening 40. One such metallurgy, for example, is a tungsten plug. First a thin layer of titanium is deposited onto the silicon exposed in the contact opening. This layer forms a chemical bond with the silicon. A layer, typically of titanium nitride is then deposited as a barrier layer. Finally tungsten metal is deposited to fill the contact opening. The tungsten is deposited by chemical vapor deposition, either by a selective process or as a blanket which is subsequently etched back by RIE leaving the tungsten plugs in the openings. An interconnection metallization layer such as of an aluminum alloy is then deposited and patterned by photolithography to form a first level of interconnective wiring.

At this juncture of processing it is possible to perform a number of quality control tests to determine the integrity of the integrated circuits thus far. These tests are performed by probing test structures which are built in concert with the integrated circuit chips. The structures are frequently formed in the region of the saw kerf which separates the product chips. The testing of these structures is sometimes referred to as post aluminum kerf(PAK) testing. One such test determines the contact resistance of the contacts just formed.

FIG. 4 is chart showing measurements of the resistance $R_c(p)$ of contacts made to p-type silicon as measured on a test structure at first PAK. The data represents measurements made on wafers subjected to BPSG reflow/oxidation in a normal oxidation furnace and on wafers thus processed in a furnace with an air leak. In addition, half of the wafers, denoted by the symbol —x—, had undergone the BPSG RIE in a single wafer etching tool while the other half, denoted by the symbol —o—, were etched in a batch type RIE tool. The values of $R_c(p)$ on the wafers processed in the leak-free furnace, and shown in the left hand side of FIG. 4 are low and fall within specifications (<80 ohm), regardless of the etching method. On the other hand, wafers undergoing the re-flow/oxidation step in the defective furnace yielded unacceptably high values of $R_c(p)$. These data, shown in the right side of FIG. 4 also show an additional dependence on the type of RIE tool used.

It now becomes urgent to pinpoint the process step responsible for the high contact resistance as quickly as possible. An abnormally high value of contact resistance could indicate a number of possible process aberrations which cause the formation of an insulative oxide within the contact. Such an oxide could be formed by the inadvertent exposure of the titanium layer to oxygen before the titanium nitride is deposited thereby forming a highly resistive layer on titanium oxide within the contact.

Another instance of resistive contacts caused by oxide formation is cited by DePinto et. al U.S. Pat. No. 5,024,972. when polysilicon is used to fill the contact opening. Oxide formation takes place at the exposed monocrystalline silicon contact during time required for the polysilicon deposition furnace to reach a uniform temperature.

The subject of this invention deals with a cause of high contact resistance, not involving insulative oxides, that is found uniquely in contacts to p-channel devices. The effect is caused by the presence of water in the oxidizing ambient during the reflow of the BPSG in an oxidizing ambient. Such an occurrence, as pointed out earlier, causes severe boron depletion of the silicon surface at the contact opening. In addition, the reason for the observed dependence on the RIE tool becomes clear when it is perceived that the single wafer etching tool imparted greater damage to the silicon than did the batch type etcher, thereby enhancing the boron segregation effect.

A common source of such water contamination are leaks at furnace seals or cracks in the fused quartz furnace tube or its attachments. Conventional methods of testing a furnace tube assembly for leaks of small magnitudes often require shutting down the furnace which is a very costly and time consuming procedure. The incorporation of a moisture monitor at the gas exit port of the furnace can signal abnormal water contamination but cannot determine if the moisture comes from a leak in the furnace assembly or from hydrocarbon contaminants in the oxygen supply.

The method taught by this invention is a quick and simple assessment of the integrity of an oxidation furnace. The technique indicates the presence of air leaks which cause high contact resistance of PMOS devices.

SUMMARY OF THE INVENTION

It is an object of this invention to describe a method for quickly and easily qualifying an oxidation furnace as being free of moisture contamination, such contamination arising from leaks in the furnace tube or from gas entry and exit components.

It is another object of this invention to provide a monitoring regimen for a dry oxidation furnace to signal the development of leaks causing moisture contamination of the oxidizing ambient.

These objects are achieved by placing a pre-cleaned test wafer in the oxidation furnace with a non-oxidizing gas flow for a prescribed thermal cycle. The wafer surface is measured before and after the thermal cycle using ellipsometry. If the furnace has a leak, ambient air enters the furnace and a film of silicon oxide grows over the wafer surface. The thickness of the oxide grown during the thermal cycle determines the severity of the air leak. An increase of oxide film thickness of more than about 40 Å, according to the prescribed cycle, is indicative of a furnace leak sufficient to cause sufficient boron depletion resulting unacceptable contact resistance.

The procedure is performed on a routine basis, such as daily or weekly, to provide a record of furnace performance and also signal the development of performance trends which would suggest appropriate remedial maintenance procedures.

BRIEF DESCRIPTION OF THE DRAWINGS

FIG. 1 is cross sectional view of the basic features of a furnace used to oxidize silicon wafers in an integrated circuit manufacturing line.

FIG. 2 is a cross sectional view of a p-channel MOSFET with a contact opening before BPSG re-flow/oxidation.

FIG. 3 is a cross sectional view of a p-channel MOSFET with a contact opening after BPSG re-flow/oxidation.

DESCRIPTION OF THE PREFERRED EMBODIMENTS

Figures 4, 5:
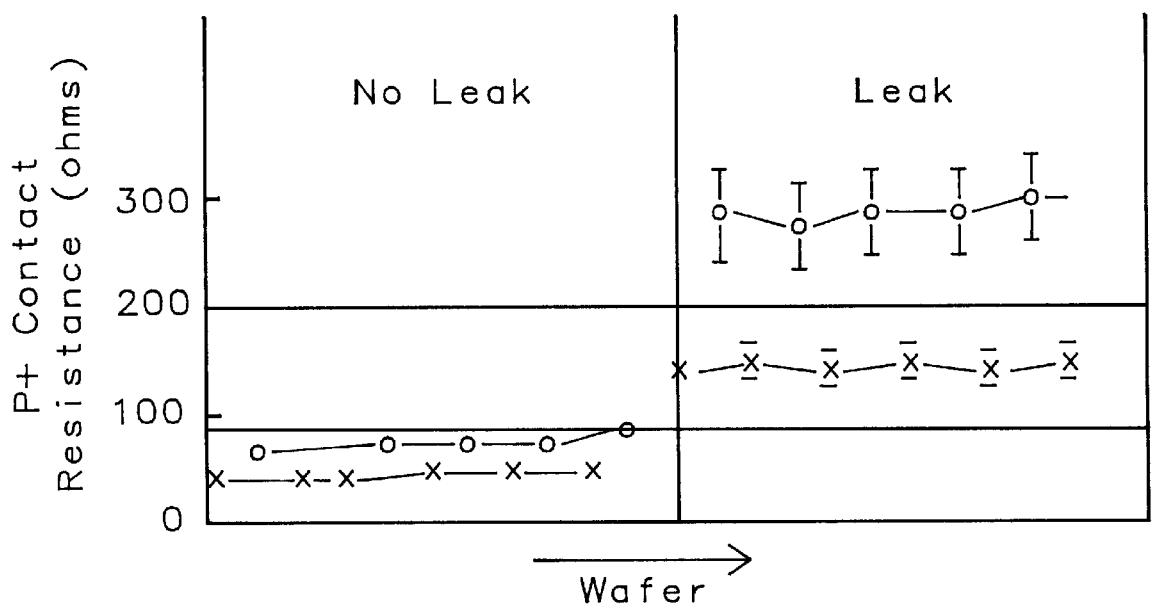
FIG. 4 is a chart showing the resistance of contacts formed to p-type active areas wherein BPSG re-flow/oxidation was performed in a normal furnace and in a furnace with an air leak.
FIG. 5 is a schematic representation of the thermal cycle used to process test wafers for the determination of furnace leaks.

Accordingly, in a preferred embodiment of this invention a p-doped <100> oriented monocrystalline silicon wafer is provided. The wafer is subjected to a cleaning procedure comprising successive treatments in a solution containing $NH_4OH$ with $H_2O_2$, a dilute HF solution, and a solution containing HCl plus $H_2O_2$. This well known cleaning technique known as RCA cleaning. The procedure was formulated by Kern and Poutinen at RCA and is often used for pre-furnace wafer preparation. The details of this procedure may be found in Wolf, S. and Tauber, R. N., "Silicon Processing for the VLSI Era", Vol. 1, Lattice Press, Sunset Beach, Calif., (1986),p516.

An initial oxide thickness measurement is made using an ellipsometer. The Rudolph model IV is preferred for this measurement, having a resolution of less than 10 Angstroms. The wafer is then inserted into the furnace to be tested. No more than 10 minutes are allowed to elapse between the time of the first thickness measurement and the time of insertion into the furnace.

The preferred thermal cycle of the furnace during the processing of the test wafer is shown in FIG. 5. Initially the furnace is equilibrated at a temperature of about 800° C. This referred to as the standby temperature. Dry nitrogen or dry argon is flowed through the furnace for a period of at least 30 minutes at a rate of about 28 Liters per minute.

The furnace is then ramped to a temperature of 1,000° C. and held there for a period of about 20 minutes after which the furnace is ramped back down to the 800° C. standby temperature. The wafer is removed and a second ellipsometric measurement is performed, again within about 10 minutes after removal from the furnace. If the difference between the first and second thickness measurement is less than 25 Å, the furnace is considered to be free of leaks. An oxide growth of greater than 35 to 40 Angstroms during the test signals the need for furnace maintenance.

The embodiment just described is a highly sensitive method which is capable of detecting levels of water contamination in the oxidizing ambient sufficient to cause resistive contacts in p-channel MOSFETS.

The procedure outlined for this embodiment may be performed on a periodic basis such as daily or weekly to ascertain the integrity of a dry oxidation furnace with respect to moisture contamination through leaks. Such a routine test will provide a record of furnace performance and also signal the development of performance trends and suggest appropriate remedial maintenance procedures. The embodiment described uses a p-type silicon wafer. It should be well understood by those skilled in the art that n-type substrate conductivities may also be used for the test wafer.

While the invention has been particularly shown and described with reference to the preferred embodiments thereof, it will be understood by those skilled in the art that various changes in form and details may be made without departing from the spirit and scope of the invention.

What is claimed is:

1. A method for detecting leaks in a dry oxidation furnace which cause failure of contacts to active elements of p-channel MOSFETS by boron depletion comprising:
   (a) providing a silicon wafer;
   (b) cleaning said silicon wafer with an aqueous HF solution;
   (c) measuring a first thickness of a silicon oxide film on said silicon wafer;
   (d) providing an oxidation furnace having
      (i) a fused quartz tube;
      (ii) a gas inlet port;
      (iii) a gas exit port;
      (iv) means for inserting and removing silicon wafers from said fused quartz tube; and
      (v) means for heating said fused quartz tube;
   (e) providing a flow of a dry gas through said oxidation furnace;
   (e) heating said oxidation furnace to a first temperature;
   (f) inserting said silicon wafer into said oxidation furnace;
   (g) ramping said oxidation furnace to a second temperature;
   (h) maintaining said oxidation furnace at said second temperature for a period of time;
   (i) ramping said oxidation furnace to said first temperature;
   (j) removing said silicon wafer;
   (k) measuring a second thickness of a silicon oxide film on said silicon wafer;
   (l) computing the difference between said first thickness and said second thickness;
   (m) comparing said difference with a calibrated value; and
   (n) determining that said oxidation furnace has a leak sufficient to cause said failure of contacts if said difference exceeds said calibrated value.

2. The method of claim 1 wherein said dry gas is selected from the group consisting of nitrogen and argon.

3. The method of claim 1 wherein said first temperature is between about 650° C. and 800° C.

4. The method of claim 1 wherein said second temperature is between about 970° C. and 1,030° C.

5. The method of claim 1 wherein said period of time is between about 25 and 35 minutes.

6. The method of claim 1 wherein said first thickness and said second thickness are measured by ellipsometry.

7. The method of claim 1 wherein said calibrated value is between about 25 and 35 Angstroms.

* * * * *